(12) United States Patent
Lu et al.

(10) Patent No.: US 9,704,858 B2
(45) Date of Patent: Jul. 11, 2017

(54) INTEGRATED DEVICE HAVING MULTIPLE TRANSISTORS

(71) Applicant: O2Micro, Inc., Santa Clara, CA (US)

(72) Inventors: Hamilton Lu, Los Angeles, CA (US); Laszlo Lipcsei, Campbell, CA (US)

(73) Assignee: O2Micro, Inc., Santa Clara, CA (US)

( * ) Notice: Subject to any disclaimer, the term of this patent is extended or adjusted under 35 U.S.C. 154(b) by 0 days.

(21) Appl. No.: 14/795,622

(22) Filed: Jul. 9, 2015

(65) Prior Publication Data

US 2017/0012040 A1 Jan. 12, 2017

(51) Int. Cl.
| | |
|---|---|
| *H01L 27/108* | (2006.01) |
| *H01L 27/07* | (2006.01) |
| *H01L 27/02* | (2006.01) |
| *H01L 21/8234* | (2006.01) |
| *H01L 29/06* | (2006.01) |

(52) U.S. Cl.
CPC .. *H01L 27/0733* (2013.01); *H01L 21/823456* (2013.01); *H01L 21/823487* (2013.01); *H01L 27/0207* (2013.01); *H01L 29/0619* (2013.01)

(58) Field of Classification Search
USPC ........................................................ 257/297
See application file for complete search history.

(56) References Cited

U.S. PATENT DOCUMENTS

| | | | |
|---|---|---|---|
| 5,387,528 A * | 2/1995 | Hutchings | H01L 29/7813 148/DIG. 126 |
| 2010/0245809 A1* | 9/2010 | Andreou | H01L 31/107 356/222 |

\* cited by examiner

*Primary Examiner* — Marvin Payen

(57) ABSTRACT

An integrated device includes a semiconductor well formed in an epitaxial layer, and a guard ring formed in the epitaxial layer and surrounding the semiconductor well. The semiconductor well and the guard ring include a type of semiconductor different from that of the epitaxial layer. The integrated device also includes an insulating layer formed atop the guard ring, and multiple gate electrodes formed on a top surface of the insulating layer, overlapping the guard ring and surrounding the semiconductor well. The gate electrodes include a first gate electrode and a second gate electrode separated by a gap. An intersecting line between the top surface of the insulating layer and a side wall of the first gate electrode partially overlaps an area that is defined based on an intersecting line between the top surface of the insulating layer and a side wall of the second gate electrode above the guard ring.

19 Claims, 12 Drawing Sheets

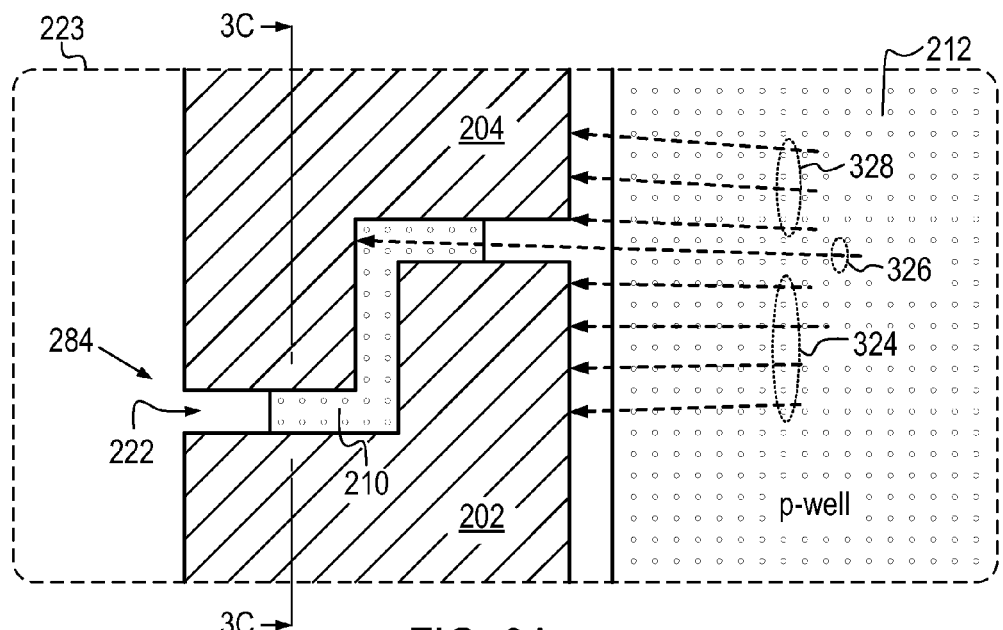
FIG. 3A
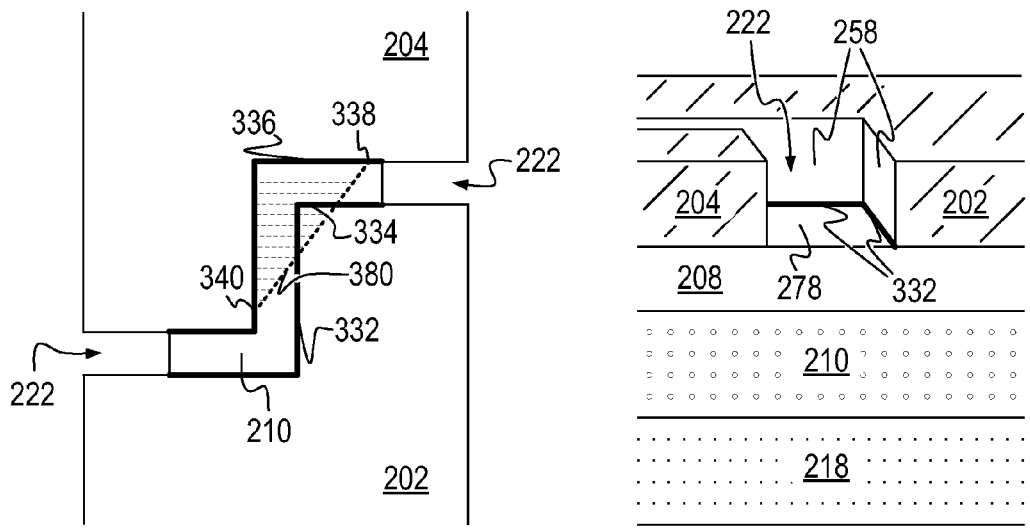
FIG. 3B
FIG. 3C

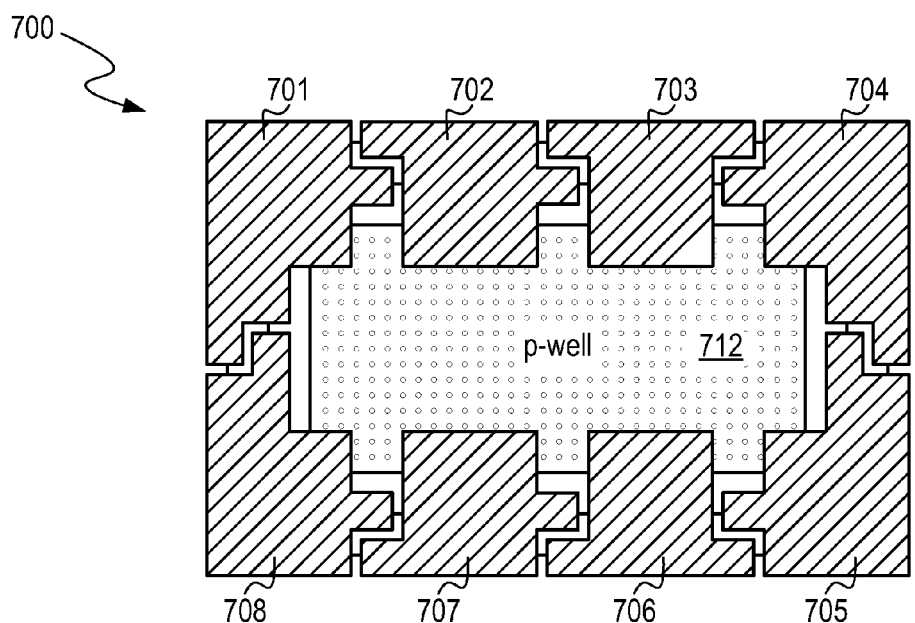
FIG. 7
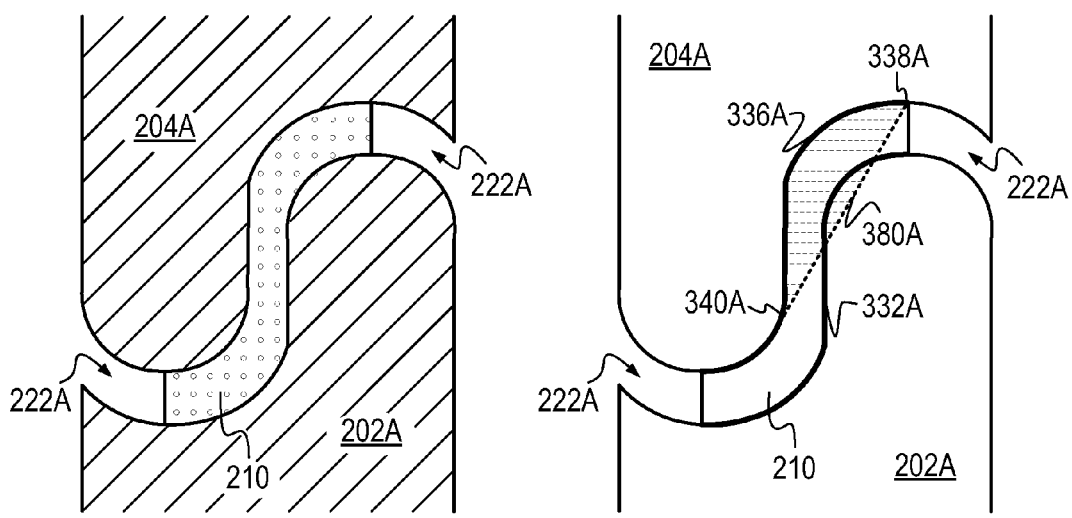
FIG. 8A(1)    FIG. 8A(2)

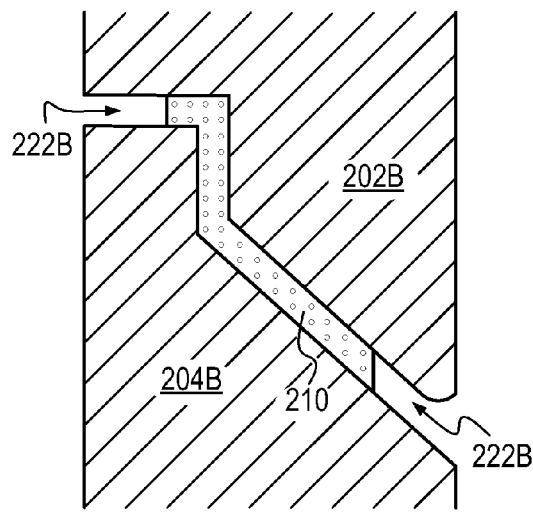
FIG. 8B(1)
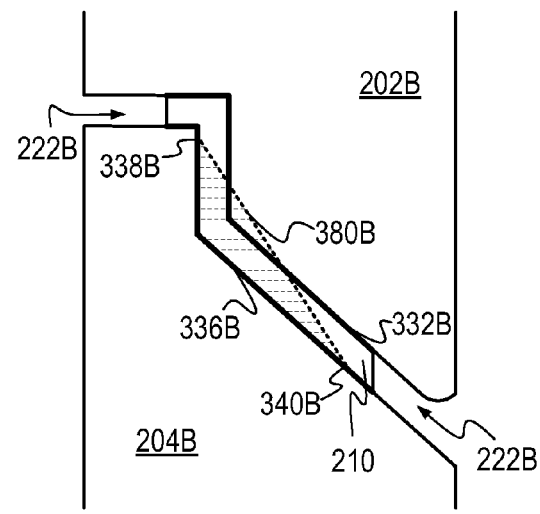
FIG. 8B(2)
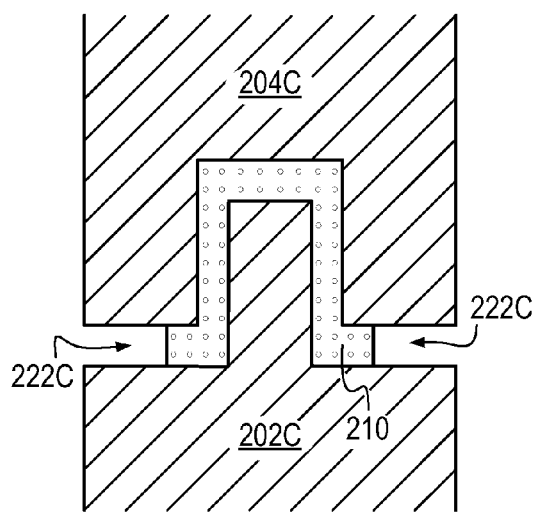
FIG. 8C(1)
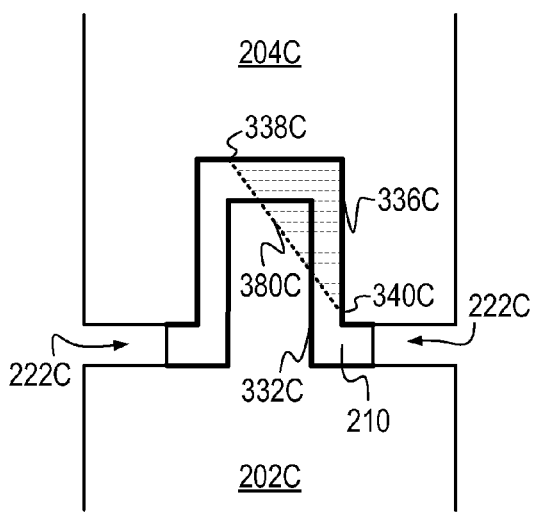
FIG. 8C(2)

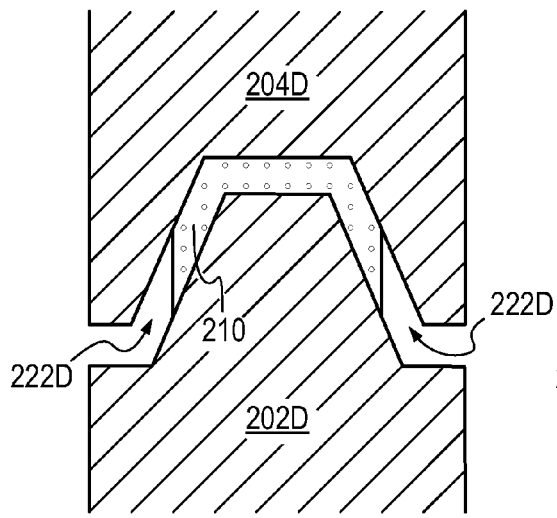
FIG. 8D(1)
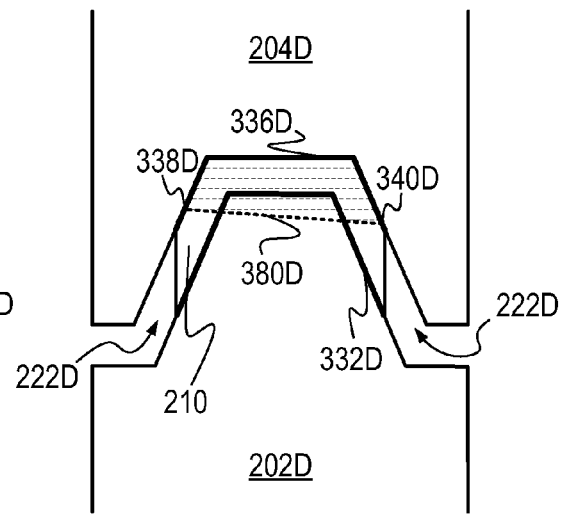
FIG. 8D(2)
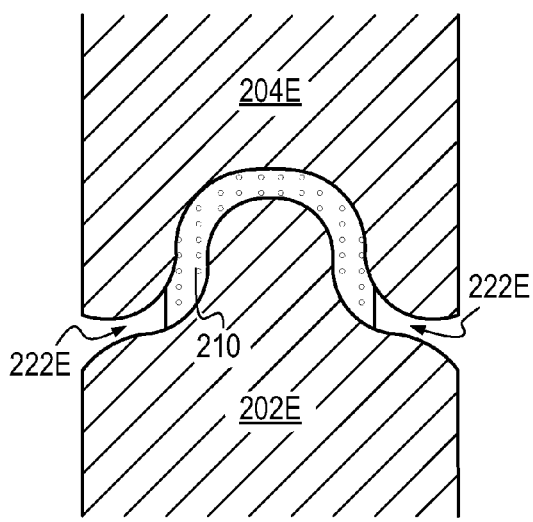
FIG. 8E(1)
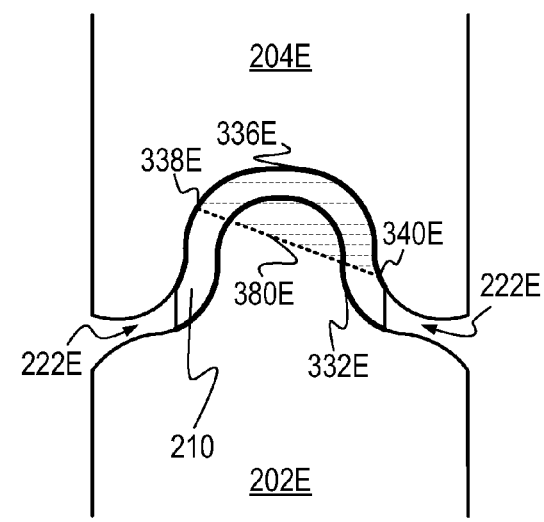
FIG. 8E(2)

INTEGRATED DEVICE HAVING MULTIPLE TRANSISTORS

BACKGROUND

FIG. 1A shows a cross-section of a conventional integrated device 100, e.g., a conventional OR gate, formed by multiple transistors. As shown in FIG. 1A, the integrated device 100 includes an n+ substrate 116, an n− epitaxial layer 118 grown on the substrate 116, and transistors 102 and 122 formed based on the epitaxial layer 118. The substrate 116 and the epitaxial layer 118 form a drain region shared by the transistors 102 and 122. The transistor 102 includes a p-well 110 and a p-type guard ring 112 formed in the epitaxial layer 118, and the guard ring 112 surrounds the p-well 110. The transistor 102 also includes an n+ well 108 formed in the p-well 110, and a source electrode 106 formed atop the n+ well 108. The transistor 102 also includes an insulating layer 114 formed atop the guard ring 112, and a gate electrode 104 formed atop the insulating layer 114. The gate electrode 104, the insulating layer 114, and the guard ring 112 form a capacitor ring surrounding the p-well 110. The capacitor ring can terminate an electric field extending from the p-well 110 to the guard ring 112 such that the drain-source breakdown voltage and the un-clamp inductive switching (UIS) current, e.g., the avalanche current, of the transistor 102 are relatively high. Similar to the transistor 102, the transistor 122 includes a p-well 130, an n+ well 128, a source electrode 126, a p-type guard ring 132, an insulating layer 114, and a gate electrode 124. The gate electrode 124, the insulating layer 114, and the guard ring 132 form a capacitor ring surrounding the p-well 130. The capacitor ring can terminate an electric field extending from the p-well 130 to the guard ring 132 such that the drain-source breakdown voltage and the UIS/avalanche current of the transistor 122 are relatively high. As shown in FIG. 1A, the source electrodes 106 and 126 are connected such that the transistors 102 and 122 share a source terminal labeled "S." The transistors 102 and 122 also share a drain terminal labeled "D." Thus, the transistors 102 and 122 form an OR gate.

FIG. 1B shows a top view of the integrated device 100 in FIG. 1A. For clarity, some portions of the integrated device 100 are not shown in FIG. 1B. More specifically, FIG. 1B shows a top view of the p-well 110 and the guard ring 112 of the transistor 102, and the rest of the transistor 102 is not shown. FIG. 1B also shows a top view of the gate electrode 124 and the source electrode 126 of the transistor 122, and the rest of the transistor 122 is covered by the electrodes 124 and 126. In the example of FIG. 1B, the p-well 110 and the guard ring 112 have planar shapes similar to a square. The p-well 110 has a side length $D_W$, the guard ring 112 has a uniform width $D_R$, and the gap between the p-well 110 and the guard ring 112 has a uniform width $D_G$. Thus, a side length $D_{TR}$ of the guard ring 112 is given by:

$$D_{TR}=D_W+2*D_R+2*D_G.$$

Thus, the transistor 102 occupies at least a planar area of $D^2_{TR}$, i.e., $(D_W+2*D_R+2*D_G)^2$. Because the transistors 102 and 122 have similar sizes, the transistors 102 and 122 together occupy at least a planar area of $2*D^2_{TR}$. Additionally, there is a gap 120 between the transistors 102 and 122 to separate the gate electrodes 104 and 124. Hence, the integrated device 100 occupies at least A planar area of $2*D^2_{TR}$ plus the planar area of the gap 120. The size of the integrated device 100 may be relatively large because of the guard rings 104 and 124 and the gap 120.

SUMMARY

In an embodiment, an integrated device includes a semiconductor well formed in an epitaxial layer, and a guard ring formed in the epitaxial layer and surrounding the semiconductor well. The epitaxial layer includes a first type of semiconductor. The semiconductor well and the guard ring include a second type of semiconductor that is different from the first type of semiconductor. The integrated device also includes an insulating layer formed atop the guard ring, and multiple gate electrodes formed on a top surface of the insulating layer, overlapping the guard ring and surrounding the semiconductor well. The gate electrodes include a first gate electrode and a second gate electrode separated by a gap. A first intersecting line between the top surface of the insulating layer and a side wall of the first gate electrode partially overlaps an area of the top surface of the insulating layer above the guard ring. The area is defined by a second intersecting line between the top surface of the insulating layer and a side wall of the second gate electrode above the guard ring and by a straight line between a first point of the second intersecting line and a second point of the second intersecting line.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

FIGS. 3A and 3B show a portion of the integrated device of FIG. 2C, in an embodiment according to the present invention.

FIG. 3C shows a cross-section of an example of a portion of an integrated device, in an embodiment according to the present invention.

FIG. 7 shows a top view of an example of an integrated device having multiple transistors, in an embodiment according to the present invention.

FIGS. 8A(1), 8A(2) 8B(1), 8B(2) 8C(1), 8C(2), 8D(1), 8D(2), 8E(1) and 8E(2) show top views of examples of a portion of an integrated device, in embodiments according to the present invention.

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "growing," "forming," "diffusing," "etching," "fabricating," or the like, refer to actions and processes of semiconductor device fabrication.

Furthermore, other fabrication processes and steps may be performed along with the processes and steps discussed herein; that is, there may be a number of processes and steps before, in between and/or after the steps shown and described herein. Importantly, embodiments of the present invention can be implemented in conjunction with these other processes and steps without significantly perturbing them. Generally speaking, the various embodiments of the present invention can replace portions of a conventional process without significantly affecting peripheral processes and steps.

It is understood that the figures are not drawn to scale, and only portions of the structures depicted, as well as the various layers that form those structures, may be shown.

Figure 2A:
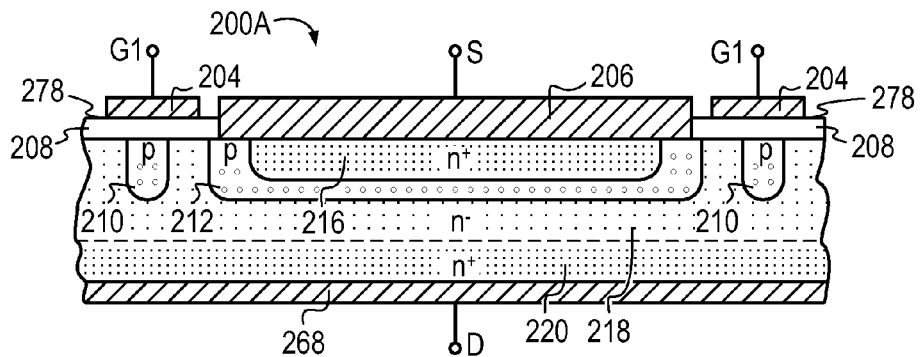
FIG. 2A shows a cross-section of an example of an integrated device, in an embodiment according to the present invention.
Figure 2B:
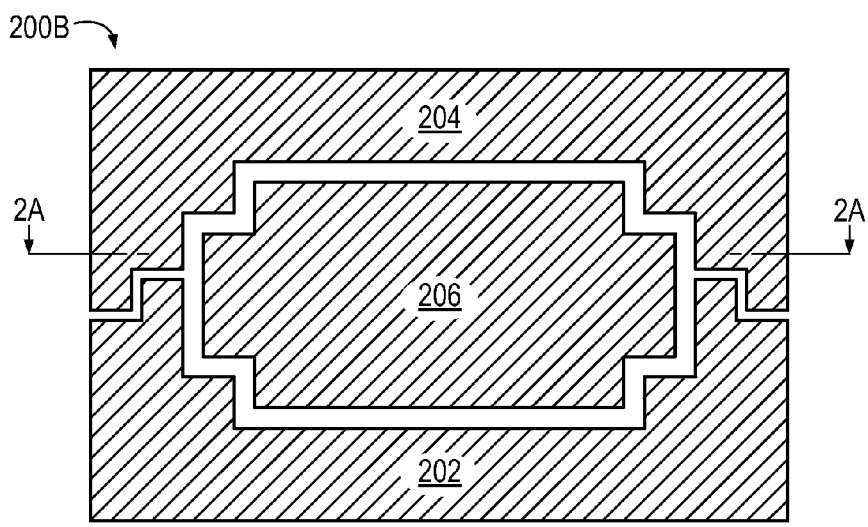
FIG. 2B shows a top view of an example of an integrated device having multiple transistors, in an embodiment according to the present invention.

FIG. 2A shows a cross-section of an example of an integrated device 200A, e.g., a cross-section of the integrated device 200B at the cutting plane line 2A-2A in FIG. 2B, in an embodiment according to the present invention. As shown in FIG. 2A, the integrated device 200A includes a semiconductor substrate 220 and an epitaxial layer 218 formed on, e.g., grown on, the semiconductor substrate 220. The semiconductor substrate 220 and the epitaxial layer 218 are made of a first type of semiconductor, e.g., n-type semiconductor. The integrated device 200A also includes a semiconductor well 212 formed in the epitaxial layer 218, and a guard ring 210 formed in the epitaxial layer 218 and surrounding the semiconductor well 212. The semiconductor well 212 and the guard ring 210 can be formed by diffusing a second type of semiconductor impurities into the epitaxial layer 218. The integrated device 200A also includes another semiconductor well 216 formed in the semiconductor well 212, e.g., by diffusing the first type of semiconductor impurities into the semiconductor well 212. The second type of semiconductor is different from the first type of semiconductor. Taking FIG. 2A for example, the first type of semiconductor includes n-type semiconductor, and the second type of semiconductor includes p-type semiconductor.

The n-type semiconductor can be obtained by adding pentavalent atoms (e.g., phosphorus (P) atoms, arsenic (As) atoms, etc.) to single-crystal silicon, such that the n-type semiconductor includes free electrons. The free electrons can be referred to as majority carriers of the n-type semiconductor. The p-type semiconductor can be obtained by adding trivalent atoms (e.g., boron (B) atoms, aluminum (Al) atoms, etc.) to single-crystal silicon, such that the p-type semiconductor includes free holes. The free holes can be referred to as majority carriers of the p-type semiconductor.

Additionally, the integrated device 200A can include a source electrode 206, e.g., a metal electrode, formed atop and electrically contacting the semiconductor well 216, a drain electrode 268, e.g., a metal electrode, formed beneath and electrically contacting the semiconductor substrate 220, and a gate electrode 204, e.g., a metal electrode, formed on a top surface 278 of an insulating layer 208 (e.g., a silicon dioxide ($SiO_2$) layer, a low temperature oxide (LTO) film, or the like) that insulates the gate electrode 204 from the semiconductor region, e.g., including the guard ring 210, the epitaxial layer 218, etc., of the integrated device 200A.

In an embodiment, the integrated device 200A includes a metal-oxide-semiconductor field-effect transistor (MOSFET). Taking FIG. 2A for example, the source electrode 206 can function as a source terminal S of the MOSFET, the drain electrode 268 can function as a drain terminal D of the MOSFET, and the gate electrode 204 can function as a gate terminal G1 of the MOSFET. The semiconductor well 216 can function as a source region of the MOSFET, parts of the semiconductor substrate 220 and epitaxial layer 218 near the semiconductor well 212 can function as a drain region of the MOSFET, and the semiconductor well 212 can function as a part of a drain-source channel of the MOSFET that can be turned on/off by a voltage applied to the gate electrode 204.

In an embodiment, FIG. 2A shows only a part, e.g., a MOSFET, of an integrated device according to an embodiment of the present invention. In an embodiment, the integrated device 200A includes multiple MOSFETs. FIG. 2A is further described in combination with FIG. 2B that shows a top view of an example 200B of the integrated device 200A, in an embodiment according to the present invention. As shown in FIG. 2B, the integrated device 200B includes gate electrodes 202 and 204, e.g., metal electrodes, that are separated from each other. The gate electrode 202, similar to the gate electrode 204, is also formed on the top surface 278 of the insulating layer 208, and can function as a gate terminal of another MOSFET. In one embodiment, the gate electrodes 202 and 204 and the source electrode 206 are separated by a material such as passivation material, e.g., PECVD (Plasma Enhanced Chemical Vapor Deposition) silicon nitride or the like.

In the example of FIG. 2B, the integrated device 200B includes two transistors. More specifically, the transistors can be metal-oxide-semiconductor field-effect transistors (MOSFETs). The gate electrode 202 functions as the gate of one of the transistors, and the gate electrode 204 functions as the gate of the other one of the transistors. Referring to FIG. 2A, in an embodiment, the transistors share a common drain region that includes, e.g., parts of the semiconductor substrate 220 and epitaxial layer 218 near the semiconductor well 212, and also share a common source region, e.g., the semiconductor well 216 (hereinafter, common source region 216). Accordingly, in an embodiment, the integrated device 200B includes an OR gate device, and the transistors can be part of the OR gate device. More specifically, in an embodiment, if a high voltage level, e.g., representing logic-high or digital "1," is applied to the common drain terminal labeled "D" of the transistors, then voltages at the gate electrodes 202 and 204 can be the input voltages of the OR gate, and a voltage at the common source terminal labeled "S" of the transistors can be the output of the OR gate.

In an embodiment, if a logic-high voltage is applied to the common drain terminal "D" of the OR gate, then the common source terminal "S" can output a logic-high voltage when one of the transistors is turned on, e.g., one of the gate electrodes 202 and 204 receives a logic-high voltage. A current may flow through the turned-on transistor, which causes the transistor to generate heat. In an embodiment, because the transistors share the common drain and common source, heat generated by one transistor can be dissipated by both of the transistors. Thus, compared with the conventional integrated device 100, the integrated device in an embodiment according to the present invention can have better heat dissipation.

Figure 2C:
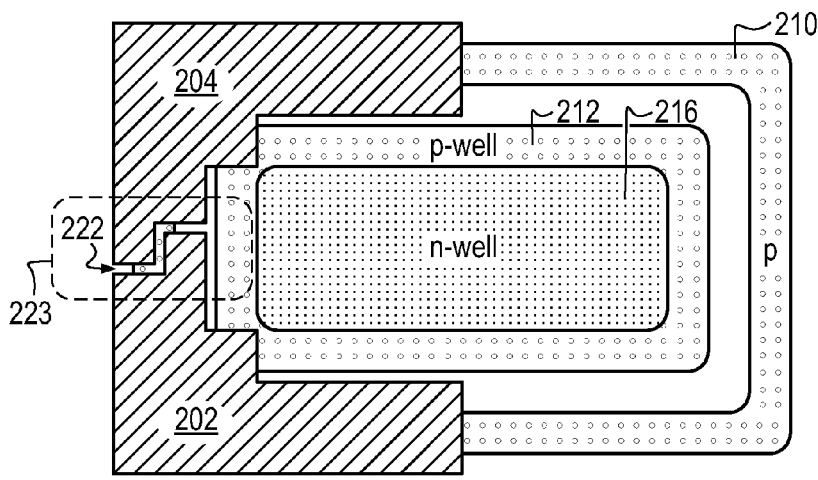
FIG. 2C shows a top view of an example of an integrated device having multiple transistors, in an embodiment according to the present invention.

FIG. 2C shows a top view of the integrated device 200A or 200B, in an embodiment according to the present invention. For clarity of illustration, some portions of the integrated device 200A or 200B (e.g., including the source electrode 206, parts of the gate electrodes 202 and 204, and the insulating layer 208) are not shown in FIG. 2C. FIG. 2C is described in combination with FIG. 2A and FIG. 2B.

As shown in FIG. 2A and FIG. 2C, the gate electrodes 202 and 204 overlap the guard ring 210 and are insulated from the guard ring 210 by the insulating layer 208. Thus, the first gate electrode 202, the insulating layer 208, and the guard ring 210 form/constitute a first capacitor (hereinafter, first capacitor (202, 208, 210)), and the second gate electrode 204, the insulating layer 208, and the guard ring 210 form/constitute a second capacitor (hereinafter, second capacitor (204, 208, 210)). When viewed from above as shown in FIG. 2C, the gate electrodes 202 and 204 and the guard ring 210 surround the semiconductor well 212 and the common source region 216, and therefore the first capacitor (202, 208, 210) and the second capacitor (204, 208, 210) also surround the semiconductor well 212 and the common source region 216.

In an embodiment, if a voltage is applied to, e.g., the drain terminal "D," of the integrated device 200A or 200B, to cause an electric field extending from the semiconductor well 212 to the guard ring 210, then majority carriers of the epitaxial layer 218 (e.g., free electrons in the examples of FIG. 2A to FIG. 2C) can be attracted to the semiconductor well 212. Avalanche breakdown in the transistors can occur more easily when more free electrons are attracted to the semiconductor well 212, which lowers a drain-source breakdown voltage of the transistors and reduces an un-clamp inductive switching (UIS) current, e.g., an avalanche current, of the transistors. In an embodiment, the first and second capacitors can absorb/capture the majority carriers from the epitaxial layer 218. The absorbed/captured majority carriers (e.g., free electrons) can form some electric charges (e.g., negative charges) that are held by the first and second capacitors, e.g., beneath the insulating layer 208 and in the guard ring 210. As a result, the first and second capacitors can terminate the electric field using those electric charges.

As shown in FIG. 2C, the first gate electrode 202 and the second gate electrode 204 are separated by a gap 222 in a region delineated by the dashed box 223. The gap 222 can be filled with a material such as passivation material, e.g., PECVD (Plasma Enhanced Chemical Vapor Deposition) silicon nitride or the like, in an embodiment. In an embodiment, the gap 222 has a specified shape that avoids leakage of the electric field. As a result, although there is a gap between the gate electrodes 202 and 204, the abovementioned first and second capacitors can terminate an electric field that can be present in the area under the gap 222. Thus, the electric field does not leak through the area of the guard ring 210 that is under the gap 222 and therefore the breakdown voltage and the UIS/avalanche current of the transistors are not reduced. More details will be described in combination with FIG. 3A and FIG. 3B.

FIG. 3A shows a top view of an example of a gap 222 between the gate electrodes 202 and 204 in the region 223, and FIG. 3B shows examples of intersecting lines 332 and 336 between the top surface 278 of the insulating layer 208 and side walls of the gate electrodes 202 and 204, in an embodiment according to the present invention. For clarity of illustration, some portions of the integrated device 200A or 200B (e.g., including the source electrode 206 and the insulating layer 208) are not shown in FIG. 3A and FIG. 3C, and the semiconductor well 212 is also not shown in FIG. 3B. FIG. 3C shows a portion of a cross-section through the region 223 at the cutting plane line 3C-3C in FIG. 3A, and illustrates an oblique view of that portion from the direction 284 as shown in FIG. 3A, in an embodiment according to the present invention. In addition, FIG. 3C shows the insulating layer 208 which is not shown in FIG. 3A. FIG. 3A, FIG. 3B and FIG. 3C are described in combination with FIG. 2A and FIG. 2C.

When a surface crosses or meets another surface, there is a line, e.g., a straight line, a curved line, a line with twists and turns, or the like, at the intersection between the two surfaces, and this line can be referred to as "intersecting line." In an embodiment, the gate electrodes 202 and 204 can be formed by etching a metal layer on the insulating layer 208 based on a photomask. Metal can be etched away from the gap 222 to expose the top surface 278 of the insulating layer 208. After metal is etched away from the gap 222, each of the gate electrodes 202 and 204 can have a side wall (or a side surface) facing the gap 222, and the side wall can cross the top surface 278 to form an intersecting line. As shown in FIG. 3C, the gate electrode 202 has a side wall 258 facing the gap 222, and an intersecting line 332 is formed at the intersection between the side wall 258 and the top surface 278 of the insulating layer 208. Similarly, the gate electrode 204 also has a side wall facing the gap 222, and an intersecting line is formed at the intersection between the side wall of the gate electrode 204 and the top surface 278 of the insulating layer 208. In FIG. 3C, because the side wall of the gate electrode 204 and the corresponding intersecting line are hidden behind the gate electrode 204, they are not shown in FIG. 3C.

Referring to FIG. 3B, the line 332 represents a first intersecting line 332 between the top surface 278 of the insulating layer 208 (shown in FIG. 2A or FIG. 3C) and a side wall 258 (shown in FIG. 3C) of the first gate electrode 202 at the gap 222 above the guard ring 210, and the line 336 represents a second intersecting line 336 between the top surface 278 of the insulating layer 208 and a side wall of the second gate electrode 204 at the gap 222 above the guard ring 210. Thus, the first intersecting line 332 represents a boundary that divides the insulating layer 208 into an area having metal formed thereon and an area having no metal formed thereon. Similarly, the second intersecting line 336 represents a boundary that divides the insulating layer 208 into an area having metal formed thereon and an area having no metal formed thereon. The first intersecting line 332 partially overlaps an area, e.g., shadowed by dashed lines as shown in FIG. 3B, of the top surface 278 of the insulating layer 208 above the guard ring 210. The area, shown in FIG. 3B, can be defined by the second intersecting line 336 and by an imaginary straight line 380 through the gap 222 and between a first point 338 of the second intersecting line 336 and a second point 340 of the second intersecting line 336.

In an embodiment, "above a guard ring" as used herein means that, when viewed from above, e.g., as shown in FIG. 3B, an element, e.g., an intersecting line such as the line 332 or 336, a side wall of the gate electrode 202 or 204, or an area such as the area shadowed in FIG. 3B, overlaps the guard ring, e.g., 210. Additionally, "partially overlaps" as used herein means that at least some part (e.g., the part 334 shown in FIG. 3B) of the intersecting line 332 is within an area defined by the intersecting line 336 and an imaginary straight line 380 between a first point 338 of the line 336 and a second point 340 of the line 336. For example, the gate electrodes 202 and 204 can be formed by photomasking and etching based on a photomask. If, according to the photomask, at least a part 334 of the intersecting line 332 should (after fabrication) be inside the area defined by the intersecting line 336 and the imaginary straight line 380, then it can be considered that the intersecting line 332 partially overlaps the area. For another example, if, according to instructions in a fabrication program (e.g., written on paper or stored in a computer-readable storage medium) that determines/controls the fabrication process of the device 200A, at least a part 334 of the intersecting line 332 should (after fabrication) be inside the area defined by the intersecting line 336 and the imaginary straight line 380, then it can be considered that the intersecting line 332 partially overlaps the area.

In an embodiment, because the intersecting line 332 partially overlaps the abovementioned area (e.g., shadowed by dashed lines as shown in FIG. 3B) defined based on the intersecting line 336, no straight line can pass through the gap 222 without crossing the intersecting lines 332 and 336. In an embodiment, from the top view of the gate electrodes 202 and 204 (or from the top view of the integrated device 200A), an electric field line (e.g., the line 326 in FIG. 3A) of the abovementioned electric field under the gap 222 is relatively straight and can be considered to be a straight line, and therefore cannot pass through the guard ring 210 under the gap 222 without passing through the areas under the gate electrodes 202 and 204. In other words, the electric field line 326 under the gap 222 cannot pass through the guard ring 210 under the gap 222 without being terminated by the first capacitor (202, 208, 210) and the second capacitor (204, 208, 210). Thus, although there is a gap 222 between the gate electrodes 202 and 204, the electric field (e.g., including the electric field lines 324, 326 and 328 in FIG. 3A) can be terminated by the first and second capacitors. Accordingly, the breakdown voltage and the UIS/avalanche current of the transistors can remain relatively high despite the gap 222 between the gate electrodes 202 and 204. In an embodiment, an UIS/avalanche current of transistors according to the present invention can be at least three times that of transistors in which the electric field leaks out through the guard ring.

Figure 4A:
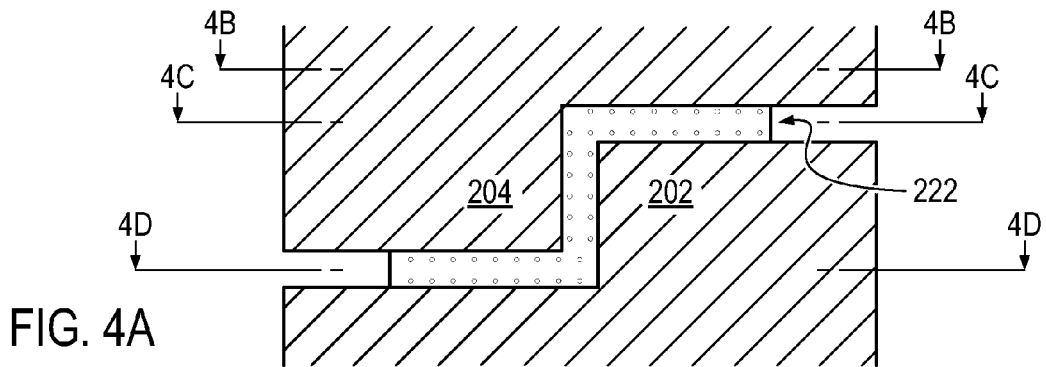
FIG. 4A shows a top view of an example of a portion of an integrated circuit, in an embodiment according to the present invention.
Figure 4B:
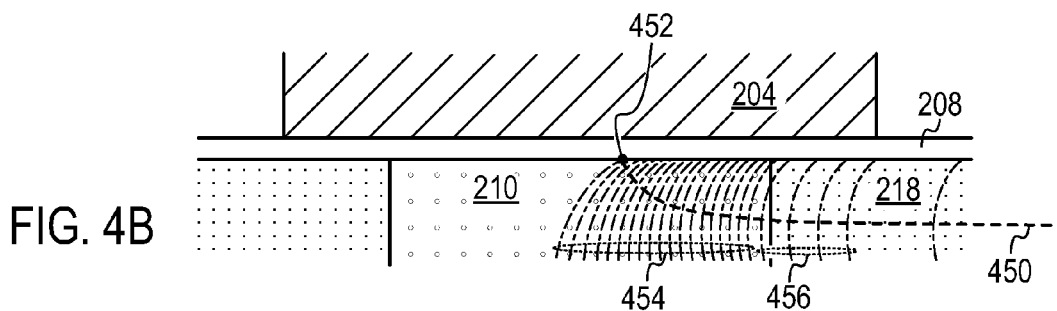
FIGS. 4B, 4C and 4D show cross-sections of examples of portions of an integrated device, in an embodiment according to the present invention.

FIG. 4A shows an enlarged top view of the abovementioned region 223, in an embodiment according to the present invention. FIG. 4B illustrates an example of a cross-sectional view through the region 223 at the cutting plane line 4B-4B in FIG. 4A, and shows an example of a termination point 452 of an electric field 450 in an integrated device, e.g., 200A or 200B, in an embodiment according to the present invention. FIG. 4B is described in combination with FIG. 2A, FIG. 2B, FIG. 2C, FIG. 3A, FIG. 3B and FIG. 4A.

As shown in FIG. 4B, there is an electric field 450 extending from the semiconductor well 212 to the guard ring 210. The lines 454 and 456 can represent equipotential lines for the electric field 450. More specifically, in an embodiment, the potential of the electric field 450 can decrease in a direction from the semiconductor well 212 to the guard ring 210 (the potential of the electric field at the semiconductor well 212 is greater than the potential of the electric field at the guard ring 210), e.g., from the right to the left shown in FIG. 4B, and a distance between adjacent lines of the equipotential lines 454 and 456 represents a potential drop of the electric field 450. In the example of FIG. 4B, distances between adjacent lines of the equipotential lines 454 and 456 represent the same potential drop.

Referring to FIG. 4B, in addition to the abovementioned second capacitor (204, 208, 210), a field plate formed by the gate electrode 204, the insulating layer 208, and the epitaxial layer 218 (hereinafter, field plate (204, 208, 218)) can also function as a capacitor to reduce the electric field from the semiconductor well 212. Thus, as shown in FIG. 4B, distances between adjacent lines toward the left side of the equipotential lines 456 under the field plate (204, 208, 218) are reduced compared with those toward the right side of the equipotential lines 456. In other words, the potential of the electric field 450 decreases faster because of the field plate (204, 208, 218). Additionally, distances between adjacent lines of the equipotential lines 454 in the guard ring 210 under the second capacitor (204, 208, 210) are further reduced. In other words, the potential of the electric field 450 decreases rapidly because of the second capacitor (204, 208, 210). As a result, the electric field 450 is terminated at a point 452 in the guard ring 210 under the second capacitor (204, 208, 210).

In an embodiment, "an electric field is terminated at a point" means that the potential of the electric field decreases to a minimum potential of the electric field at the point.

Taking FIG. 4B for example, the potentials may be different in different areas of the guard ring 210, and these potentials have a minimum potential. The potential of the electric field 450 can decrease in a direction from the semiconductor well 212 to the guard ring 210 and decease to the minimum potential at the point 452. In other words, the equipotential line where the point 452 is located (e.g., at the far left of the equipotential lines 454 shown in FIG. 4B) can have a potential equal to that in the area of the guard ring 210 at the left side of the equipotential lines 454.

In an embodiment, an electric field extenting from the semiconductor well 212 to the guard ring 210 can also be terminated by the abovementioned first capacitor (202, 208, 210) and a field plate formed by the gate electrode 202, the insulating layer 208, and the epitaxial layer 218 (hereinafter, field plate (202, 208, 218)), in a similar manner.

Figure 4C:
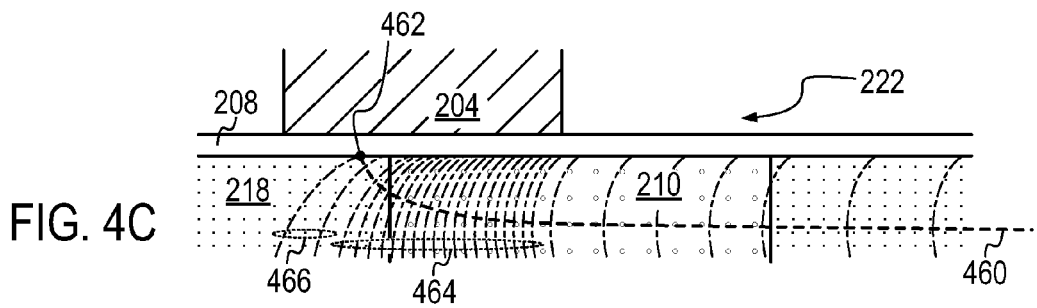

FIG. 4C illustrates an example of a cross-sectional view through the region 223 at the cutting plane line 4C-4C in FIG. 4A, and shows an example of a termination point 462 of an electric field 460 in an integrated device, e.g., 200A or 200B, in an embodiment according to the present invention. FIG. 4B is described in combination with FIG. 2A, FIG. 2B, FIG. 2C, FIG. 3A, FIG. 3B, FIG. 4A and FIG. 4B.

In an embodiment, an electric field 460 can extend from the semiconductor well 212 to the guard ring 210 under the gap 222, and the electric field 460 can be terminated at a point 462 in the guard ring 210 or near the guard ring 210. More specifically, similar to the lines 454 and 456 in FIG. 4B, the lines 464 and 466 in FIG. 4C can represent equipotential lines for the electric field 460, and distances between adjacent lines of the equipotential lines 464 and 466 can represent the same potential drop of the electric field 460. According to the equipotential lines 464 shown in FIG. 4C, the potential of the electric field 460 can decrease rapidly in the guard ring 210 because of the second capacitor (204, 208, 210). In an embodiment, the electric field 460 can be terminated at a point (not shown in FIG. 4C) in the guard ring 210 if the size of the guard ring 210 is big enough. In another embodiment, the size of the guard ring 210 can be reduced to reduce the size of the integrated device, which results in a small amount (e.g., 5%, 1%, etc.) of the electric field 460 passing through the guard ring 210. In one such embodiment, the gate electrode 204 can be formed with a width greater than that of the guard ring 210. In FIG. 4C, for example, the gate electrode 204 is formed on the insulating layer 208, overlapping the guard ring 210, and extending out from the guard ring 210. Hence, the extended part of the gate electrode 204, the insulating layer 208, and the epitaxial layer 218 can form a field plate (204, 208, 218) to terminate the electric field 460 at a point 462 under the field plate (204, 208, 218).

Figure 4D:
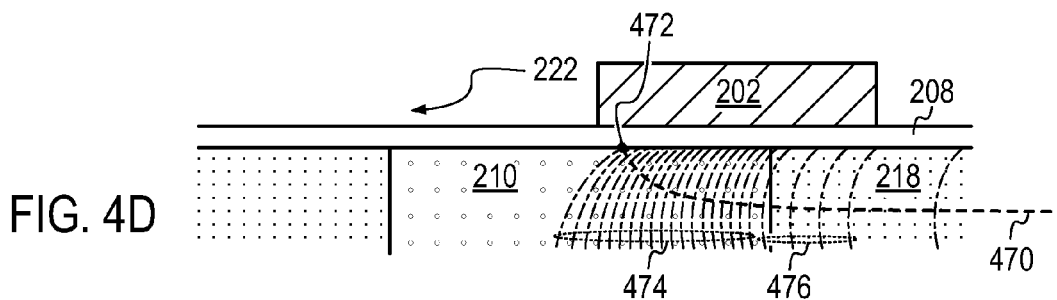

FIG. 4D shows an example of a cross-sectional view through the region 223 at the cutting plane line 4D-4D in FIG. 4A, and shows an example of a termination point 472 of an electric field 470 in an integrated device, e.g., 200A or 200B, in an embodiment according to the present invention. FIG. 4B is described in combination with FIG. 2A, FIG. 2B, FIG. 2C, FIG. 3A, FIG. 3B, FIG. 4A and FIG. 4B.

Similar to those described in relation to FIG. 4B, in the example of FIG. 4D, the line 470 can represent an electric field extending from the semiconductor well 212 to the guard ring 210, and the lines 474 and 476 can represent equipotential lines for the electric field 470. As shown in FIG. 4D, although there is a gap 222 between the gate electrodes 202 and 204, the electric field 470 can be terminated at a point 472 before reaching an area of the guard ring 210 under the gap 222. In other words, the electric field 470 is terminated at a point 472 in an area of the guard ring 210 under the first capacitor (202, 208, 210).

Referring to FIG. 4B, FIG. 4C and FIG. 4D, the electric fields 450, 460 and 470 can be terminated at a surface of the silicon area, e.g., including the guard ring 210 and the epitaxial layer 218, that is between the silicon area and the insulating layer 208. Such technology can be referred to as RESURF (Reduced Surface Field) technology.

Consequently, although there is a gap 222 between the gate electrodes 202 and 204, an electric field extending from the semiconductor well 212 to the guard ring 210 under the gap 222 can be terminated. Since leakage of electric field can be avoided, a breakdown voltage and an UIS/avalanche current of the integrated device can be relatively high.

Figure 5:
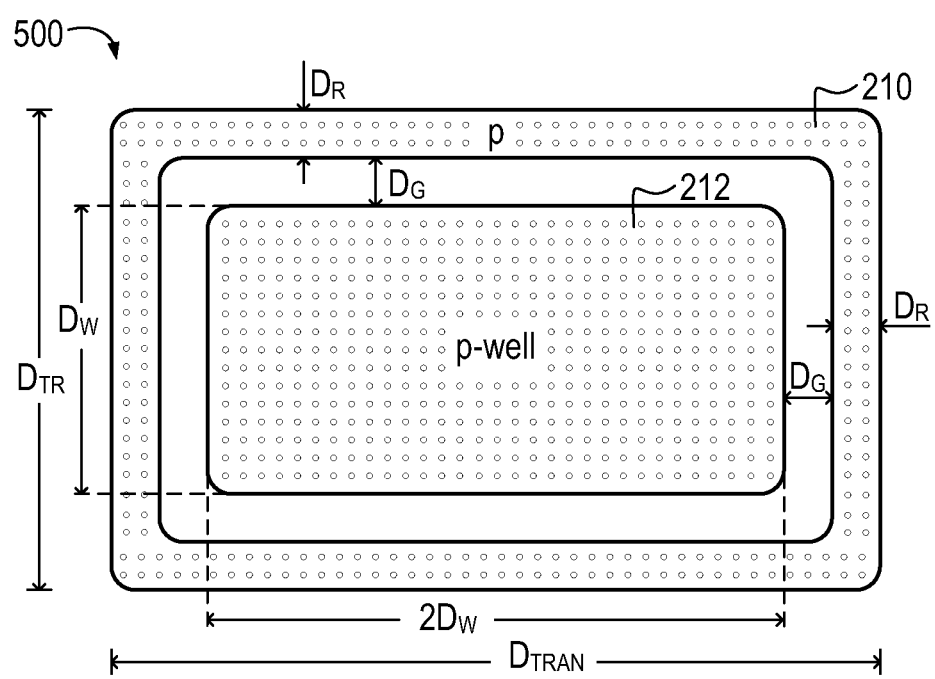
FIG. 5 shows a top view of an integrated device, in an embodiment according to the present invention.

FIG. 5 shows examples of dimensions of an integrated device 500, e.g., the device 200A or 200B, in an embodiment according to the present invention. In the example of FIG. 5, the semiconductor well 212 and the guard ring 210 have planar shapes similar to a rectangle. The semiconductor well 212 has a short-side length $D_W$, e.g., equal to the side length of the p-well 110 in the conventional integrated device 100, and has a long-side length $2*D_W$, e.g., equal to twice the side length of the p-well 110. The guard ring 210 has a uniform width $D_R$, e.g., equal to the width of the guard ring 112 in the conventional integrated device 100. The gap between the semiconductor well 212 and the guard ring 210 has a uniform width $D_G$, e.g., equal to that between the p-well 110 and the guard ring 112.

Thus, in the example of FIG. 5, the planar area of the semiconductor well 212 is substantially equal to the total planar area of the p-wells 110 and 130 in the conventional integrated device 100. In an embodiment, a maximum operating current flowing through a transistor is, e.g., linearly, proportional to a cross-sectional area of a drain-source channel of the transistor. In the example of FIG. 5, the planar area of the semiconductor well 212 can represent a cross-sectional area of a drain-source channel shared by the transistors. Similarly, the planar areas of the p-wells 110 and 130 can represent cross-sectional areas of drain-source channels of the transistors 102 and 122. Thus, the maximum operating current of the integrated device 500 can be substantially equal to that of the conventional integrated device 100.

Additionally, the short-side length $D_{TR}$ of the guard ring 210 can be equal to the side length of the guard ring 112 in the conventional integrated device 100, and is given by:

$$D_{TR}=D_W+2*D_R+2*D_G.$$

The long-side length $D_{TRAN}$ of the guard ring 210 can be given by:

$$D_{TRAN}=2*D_W+2*D_R+2*D_G=D_{TR}+D_W.$$

Thus, the integrated device 500 occupies at least a planar area given by:

$$D_{TRAN}*D_{TR}=D^2_{TR}+D_{TR}*D_W.$$

Figure 1A:
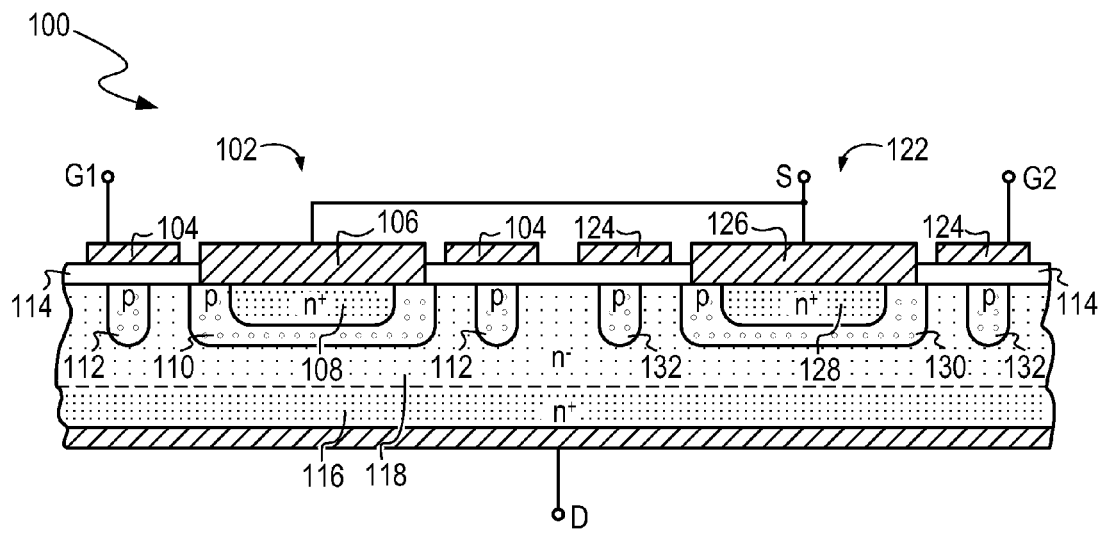
FIG. 1A shows a cross-section of a conventional integrated device having multiple transistors.
Figure 1B:
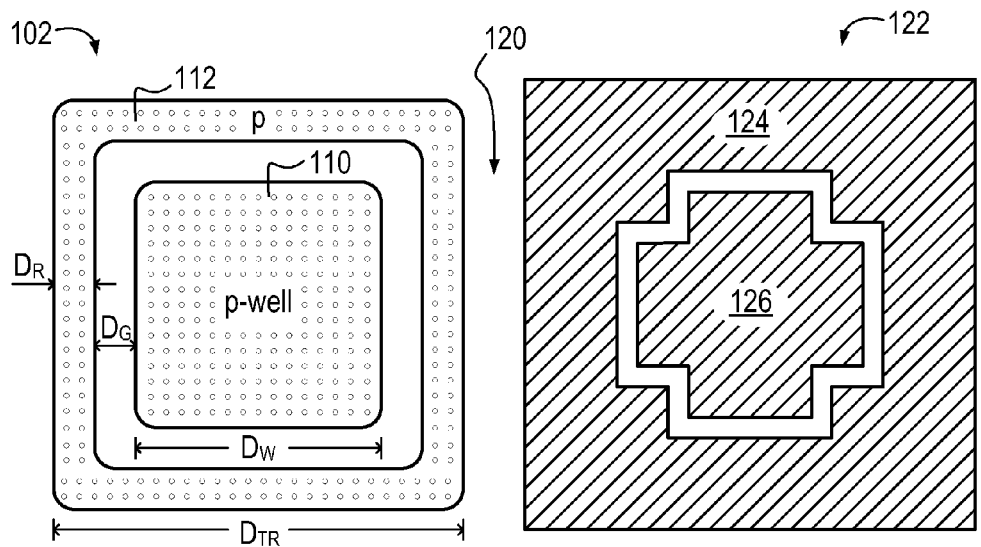
FIG. 1B shows a top view of the conventional integrated device in FIG. 1A.

As described in relation to FIG. 1B, the conventional integrated device 100 occupies at least a planar area of $2*D^2_{TR}$ plus the planar area of the gap 120. Because the value of $D_W$ is less than the value of $D_{TR}$, and the gap between the gate electrodes 202 and 204 does not occupy additional area, the integrated device 500 occupies less area compared with the conventional integrated device 100.

Thus, compared with the conventional integrated device 100, the integrated device 500 has a smaller size. Although the integrated device 500 has a smaller size, the integrated device 500 can still have a maximum operating current substantially equal to that of the conventional integrated device 100.

Additionally, because the integrated device 500 has a smaller size, the integrated device 500 has higher frequency response, better efficiency, and a denser 2N+1 architecture (e.g., an architecture in which transistors share a common drain in a substrate), compared to the conventional integrated device 100.

Moreover, as discussed above, the integrated device in an embodiment according to the present invention has multiple transistors. FIG. 2B, for example, shows a first transistor represented by the gate electrode 202, and a second transistor represented by the gate electrode 204. In one embodiment, the first and second transistors include re-channel transistors. Thus, if the first or second transistor is turned on, then a voltage level at the gate electrode 202 or 204 is higher than a voltage level at the drain electrode 268 (shown in FIG. 2A), which causes the voltage level at the gate electrode 202 or 204 to be higher than a voltage level at the guard ring 210. If the first or second transistor is turned off, then a voltage level at the drain electrode 268 is higher than a voltage level at the gate electrode 202 or 204, which causes a voltage level at the guard ring 210 to be higher than the voltage level at the gate electrode 202 or 204. Thus, if the first transistor is turned on and the second transistor is turned off, then a voltage level at the gate electrode 202 is higher than a voltage level at the guard ring 210, and the voltage level at the guard ring 210 is higher than a voltage level at the gate electrode 204. In one embodiment, the gate electrode 202 functions as a terminal of the first capacitor (202, 208, 210), the guard ring 210 functions as another terminal of the first capacitor (202, 208, 210) and a terminal of the second capacitor (204, 208, 210), and the gate electrode 204 functions as another terminal of the second capacitor (204, 208, 210). As a result, if the first transistor is turned on and the second transistor is turned off, then the first capacitor (202, 208, 210) and the second capacitor (204, 208, 210) are coupled in series, which reduces the operating capacitance of the integrated device. In other words, the operating capacitance of the integrated device, when a transistor is turned on and another transistor is turned off, in an embodiment according to the present invention, can be less than that of the conventional integrated device 100. Thus, the integrated device in an embodiment according to the present invention has less power consumption, higher frequency response, and better efficiency.

Furthermore, the first capacitor (202, 208, 210) and the second capacitor (204, 208, 210) share the guard ring 210. In one embodiment, if the first transistor is turned on, then the first capacitor (202, 208, 210) is charged to have an amount of electric charges, e.g., positive charges are held in the gate electrode 202 and negative charges are held in an area of the guard ring 210 under the gate electrode 202. In a switching process that switches off the first transistor and switches on the second transistor, the negative charges can flow in the guard ring 210 from the area under the gate electrode 202 to an area under the gate electrode 204, which reduces power consumption and shortens the time for switching on the second transistor compared with the conventional integrated device 100. As a result, the frequency response and efficiency of the integrated device in an embodiment according to the present invention is further improved.

Figure 6A:
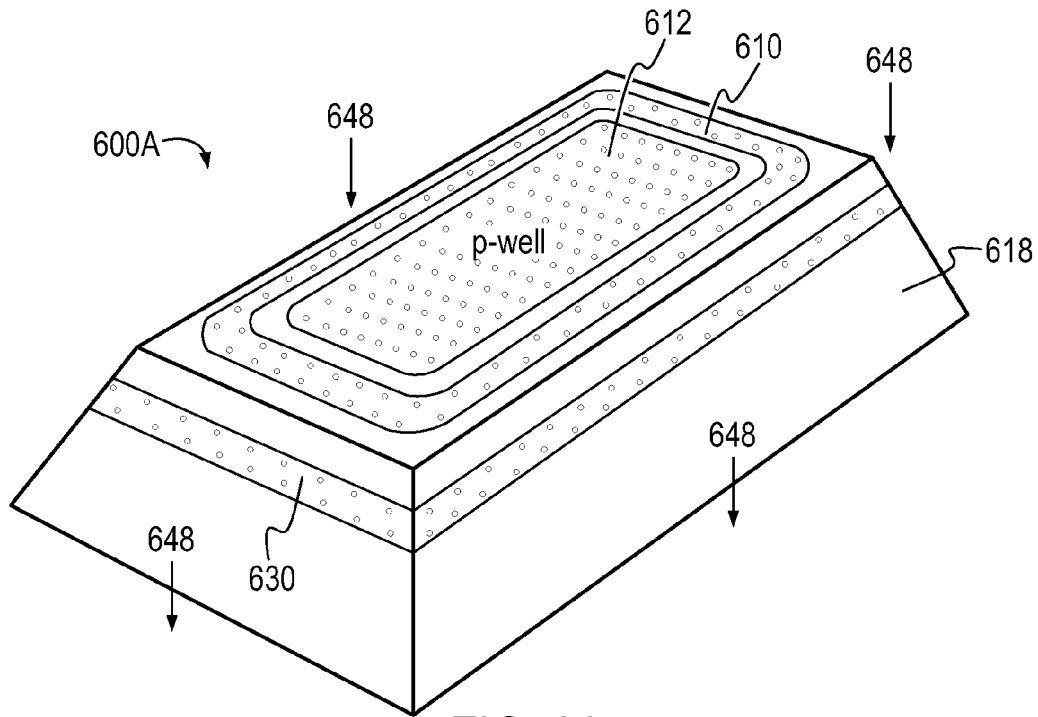
FIG. 6A shows a three-dimensional diagram of an example of an integrated device, in an embodiment according to the present invention.

FIG. 6A shows a three-dimensional diagram of an example of an integrated device 600A, in an embodiment according to the present invention. For clarity of illustration, some portions of the integrated device 600A are not shown in FIG. 6A. As shown in FIG. 6A, the integrated device 600A includes a semiconductor well 612 (e.g., similar to the semiconductor well 212) and a first guard ring 610 (e.g., similar to the guard ring 210). The semiconductor well 612 and the first guard ring 610 are formed in an epitaxial layer 618 of the integrated device 600A. The integrated device 600A also includes a trench-like structure 648 that surrounds the semiconductor well 612 and that separates the integrated device 600A from adjacent, similar integrated devices. The integrated device 600A also includes a second guard ring 630 formed on the side walls of the trench-like structure 648 and surrounding the semiconductor well 612. The trench-like structure 648 may be formed by etching the epitaxial layer 618. The second guard ring 630 (e.g., similar to the guard ring 210) can be formed by diffusing the second type of semiconductor impurities into the epitaxial layer 618 on the side walls of the trench-like structure 648. The trench-like structure 648 can be filled with a material such as passivation material, e.g., PECVD (Plasma Enhanced Chemical Vapor Deposition) silicon nitride or the like, after forming gate electrodes 602 and 604 shown in FIG. 6B in an embodiment.

Figure 6B:
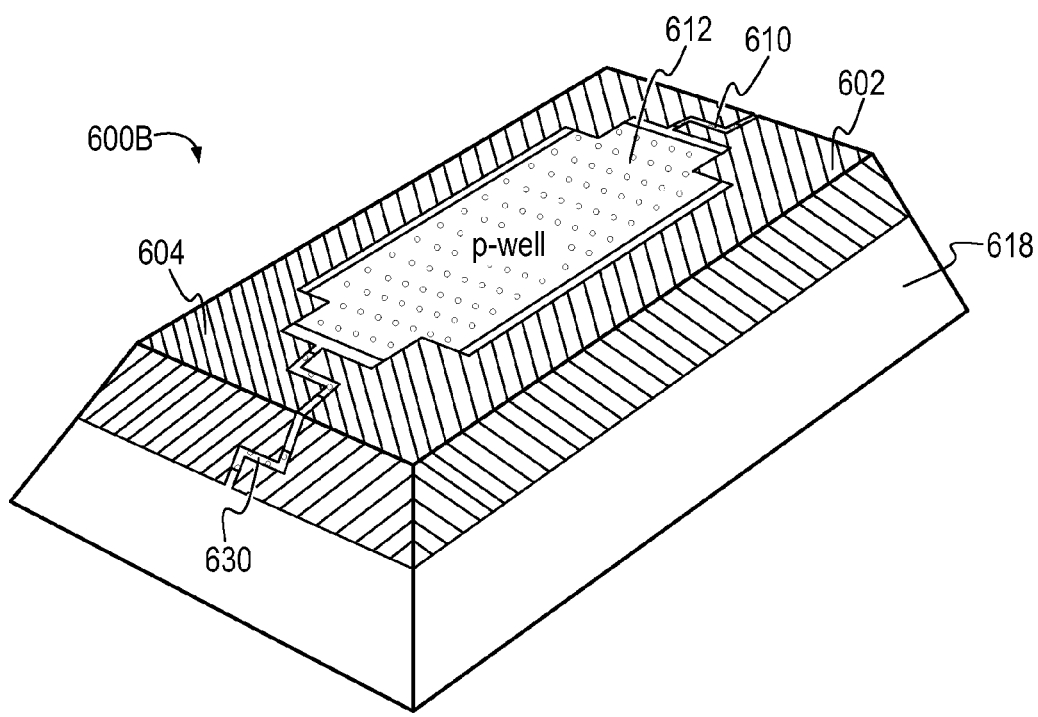
FIG. 6B shows a three-dimensional diagram of an example of an integrated device having multiple transistors, in an embodiment according to the present invention.

FIG. 6B shows a three-dimensional diagram of an example of an integrated device 600B having multiple transistors, in an embodiment according to the present invention. FIG. 6B is similar to FIG. 6A except that FIG. 6B also shows a first gate electrode 602 and a second gate electrode 604. Similar to the gate electrodes 202 and 204, the gate electrodes 602 and 604 are formed on a top surface of an insulating layer (not shown in FIG. 6B), e.g., similar to the insulating layer 208. The insulating layer is formed atop the epitaxial layer 618, the guard rings 610 and 630, and the semiconductor well 612 to insulate them from the gate electrodes 602 and 604. The gate electrodes 602 and 604 are formed atop the insulating layer and overlapping the guard rings 610 and 630. Thus, the first gate electrode 602, the insulating layer, and the first guard ring 610 can form a first capacitor; the second gate electrode 604, the insulating layer, and the first guard ring 610 can form a second capacitor; the first gate electrode 602, the insulating layer, and the second guard ring 630 can form a third capacitor; and the second gate electrode 604, the insulating layer, and the second guard ring 630 can form a fourth capacitor. The first and second capacitors can terminate an electric field extending from the semiconductor well 612 to the first guard ring 610, and the third and fourth capacitors can terminate an electric field extending from the semiconductor well 612 to the second guard ring 630. In an embodiment, if the width of the first guard ring 610 is wide enough, then the electric field extending from the semiconductor well 612 to the first guard ring 610 can be terminated completely. Reducing the width of the first guard ring 610 may result in a part of the electric field not being terminated and the part of electric field extending outward through the first guard ring 610. In an embodiment, the third and fourth capacitors can terminate that part of electric field. Thus, the width of the first guard ring 610 can be reduced, which reduces the size of the integrated device 600B.

Thus, in an embodiment, the integrated device 600B can terminate an electric field extending from the semiconductor well 612 to the guard rings 610 and 630 such that a breakdown voltage and an UIS/avalanche current of the integrated device 600B can be relatively high. In addition, compared with an integrated device which has only one guard ring, the integrated device 600B can have a smaller size.

Figure 6C:
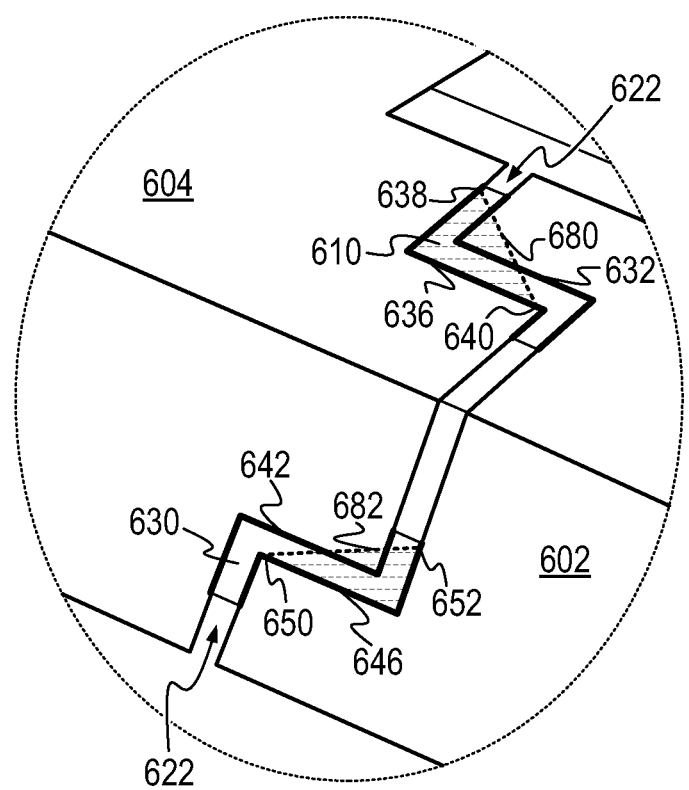
FIG. 6C shows a portion of the integrated device of FIG. 6B, in an embodiment according to the present invention.

Furthermore, similar to the gate electrodes 202 and 204, the gate electrodes 602 and 604 are separated by a gap. An enlarged view of an example of a gap 622 between the gate electrodes 602 and 604 is illustrated in FIG. 6C. As shown in FIG. 6C, the line 632 represents a first intersecting line 632 between the top surface of the abovementioned insulating layer and a side wall of the first gate electrode 602 at the gap 622 above the first guard ring 610 (the insulating layer insulates the epitaxial layer 618, the guard rings 610 and 630, and the semiconductor well 612 from the gate electrodes 602 and 604), and the line 636 represents a second intersecting line 636 between the top surface of the insulating layer and a side wall of the second gate electrode 604 at the gap 622 above the first guard ring 610. The first intersecting line 632 partially overlaps a first area, e.g., shadowed by dashed lines as shown in FIG. 6C, of the top surface of the insulating layer above the first guard ring 610. The first area can be defined by the second intersecting line 636 and by an imaginary straight line 680 between a first point 638 of the second intersecting line 636 and a second point 640 of the second intersecting line 636. Similarly, the line 642 represents a third intersecting line 642 between the top surface of the insulating layer and a side wall of the second gate electrode 604 at the gap 622 above the second guard ring 630, and the line 646 represents a fourth intersecting line 646 between the top surface of the insulating layer and a side wall of the first gate electrode 602 at the gap 622 above the second guard ring 630. The third intersecting line 642 partially overlaps a second area, e.g., shadowed by dashed lines as shown in FIG. 6C, of the top surface of the insulating layer above the second guard ring 630. The second area can be defined by the fourth intersecting line 646 and by an imaginary straight line 682 between a third point 650 of the fourth intersecting line 646 and a fourth point 652 of the fourth intersecting line 646. As a result, the abovementioned first, second, third and fourth capacitors can avoid leakage of electric field through an area under the gap 622.

In the abovementioned examples, the integrated device includes two transistors defined in part by two gate electrodes, e.g., 202 and 204, or 602 and 604. However, the invention is not so limited. In other embodiments, the integrated device can include three or more transistors defined in part by three or more corresponding gate electrodes. The integrated device can also include a common drain and a common source. Thus, the three or more transistors can constitute a multi-input OR gate.

In FIG. 7, for example, the integrated device 700 can include gate electrodes 701, 702, 703, 704, 705, 706, 707 and 708 that are separated from each other. The integrated device 700 also includes a common drain and a common source (not shown in FIG. 7). Thus, the integrated device 700 can be an eight-input OR gate. The eight gate electrodes, an insulating layer (not shown) beneath the electrodes, and a guard ring beneath the insulating layer can form eight capacitors surrounding the semiconductor well 712. The eight capacitors can terminate an electric field extending from the semiconductor well 712 to the guard ring. As shown in FIG. 7, at a gap between each pair of adjacent gate electrodes (e.g., electrodes 701 and 702, electrodes 702 and 703, etc.), there are a first intersecting line between the top surface of the insulating layer and a side wall of one of the adjacent gate electrodes above the guard ring, and a second intersecting line between the top surface of the insulating layer and a side wall of the other one of the adjacent gate electrodes above the guard ring. The first intersecting line partially overlaps an area, e.g., similar to the areas shadowed by dashed lines as shown in FIG. 3B and FIG. 6C, defined based on the second intersecting line. Thus, although there are gaps between the gate electrodes, the capacitors can avoid leakage of electric fields in the areas under the gaps.

In the abovementioned examples, the shapes of the gaps between the gate electrodes are similar in shape to the letter "Z" or a flipped version of the letter "Z." However, those shapes are disclosed for illustration purposes and are not intended to limit the invention. In other embodiments, the gaps between two gate electrodes can have shapes different from those in the abovementioned examples.

Examples of gaps 222A, 222B, 222C, 222D and 222E between gate electrodes are illustrated in FIGS. 8A(1), 8A(2) 8B(1), 8B(2) 8C(1), 8C(2), 8D(1), 8D(2), 8E(1) and 8E(2), in other embodiments according to the present invention. As shown in FIGS. 8A(1), 8A(2) 8B(1), 8B(2) 8C(1), 8C(2), 8D(1), 8D(2), 8E(1) and 8E(2), a side wall of a first gate electrode (e.g., 202A, 202B, 202C, 202D or 202E) and a top surface of an insulating layer, e.g., similar to the insulating layer 208 in FIG. 2A or FIG. 3C, has a first intersecting line (e.g., 332A, 332B, 332C, 332D or 332E) therebetween above a guard ring 210, and a side wall of a second gate electrode (e.g., 204A, 204B, 204C, 204D or 204E) and the top surface of the insulating layer has a second intersecting line (e.g., 336A, 336B, 336C, 336D or 336E) therebetween above the guard ring 210. The first intersecting line (e.g., 332A, 332B, 332C, 332D or 332E) partially overlaps an area, e.g., shadowed by dashed lines as shown in FIG. 8A(2), FIG. 8B(2), FIG. 8C(2), FIG. 8D(2), or FIG. 8E(2). The area can be defined by the second intersecting line (e.g., 336A, 336B, 336C, 336D or 336E) and an imaginary straight line (e.g., 380A, 380B, 380C, 380D or 380E) through the gap (e.g., 222A, 222B, 222C, 222D or 222E) and between a first point (e.g., 338A, 338B, 338C, 338D or 338E) of the second intersecting line and a second point (e.g., 340A, 340B, 340C, 340D or 340E) of the second intersecting line. Thus, no straight line can pass through the gap (e.g., 222A, 222B, 222C, 222D or 222E) without crossing the first intersecting line (e.g., 332A, 332B, 332C, 332D or 332E) and the second intersecting line (e.g., 336A, 336B, 336C, 336D or 336E). In an embodiment, an electric field line under the gap (e.g., 222A, 222B, 222C, 222D or 222E) is relatively straight and can be considered to be a straight line, and therefore cannot pass through the guard ring 210 under the gap (e.g., 222A, 222B, 222C, 222D or 222E) without passing through the areas under the first gate electrode (e.g., 202A, 202B, 202C, 202D or 202E) and the second gate electrode (e.g., 204A, 204B, 204C, 204D or 204E). As a result, leakage of electric field under the gap (e.g., 222A, 222B, 222C, 222D or 222E) can be avoided.

In the examples of FIG. 2A and FIG. 2C, the common source region includes one semiconductor well, e.g., the n-well 216. However, the invention is not so limited. In another embodiment, the common source region can include multiple semiconductor wells electrically connected with each other.

Figure 9A:
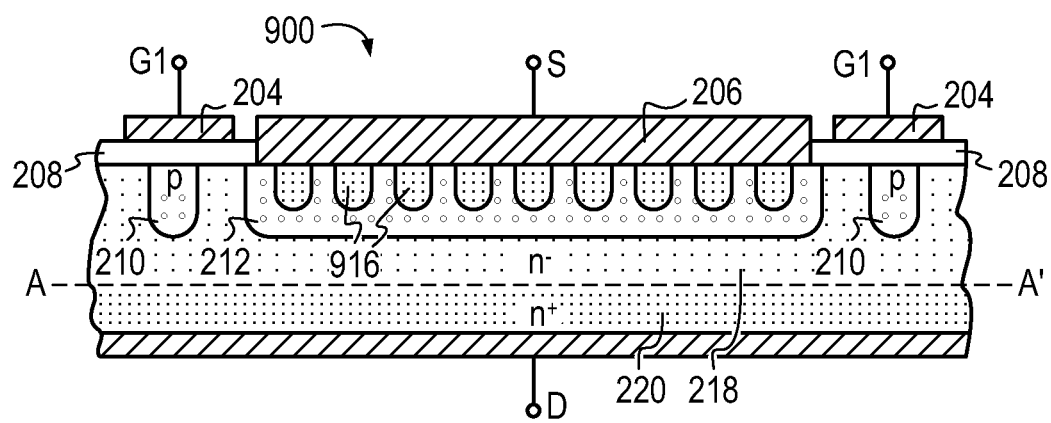
FIG. 9A shows a cross-section of an example of an integrated device, in an embodiment according to the present invention.
Figure 9B:
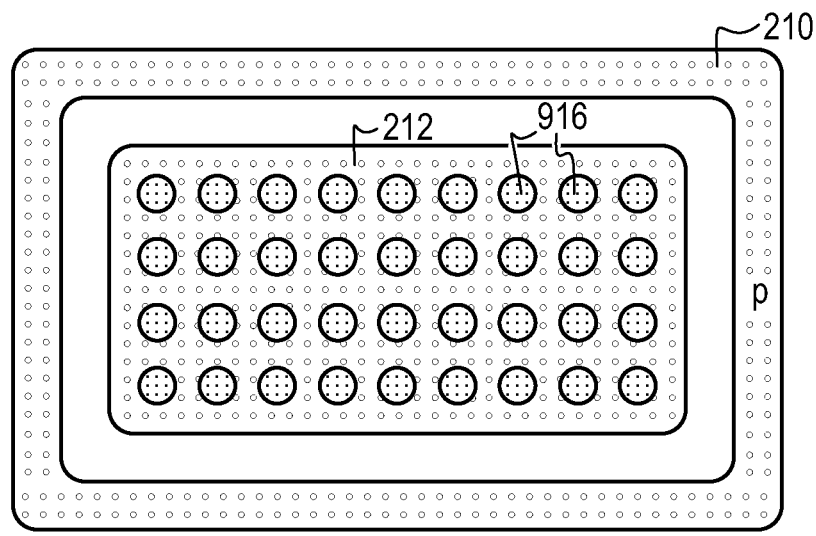
FIG. 9B shows a top view of an example of an integrated device, in an embodiment according to the present invention.

FIG. 9A shows a cross-section of an example of an integrated device 900, in an embodiment according to the present invention. FIG. 9B shows a top view of an example of the integrated device 900, in an embodiment according to the present invention. FIG. 9A and FIG. 9B are described in combination with FIG. 2A and FIG. 2C.

As shown in FIG. 9A, the integrated device 900 is similar to the integrated device 200A in FIG. 2A except that the integrated device 900 includes multiple semiconductor wells 916, e.g., n-wells (hereinafter, n-wells 916), formed in the semiconductor well 212, e.g., p-well (hereinafter, p-well 212). The n-wells 916 are electrically connected with each other through the source electrode 206. Thus, the n-wells 916 can function as a common source region for the integrated device 900. In an embodiment, the n-wells 916 can be, but not necessarily, evenly distributed (e.g., equidistant from one another) in the p-well 212, as shown in FIG. 9B.

Figure 10:
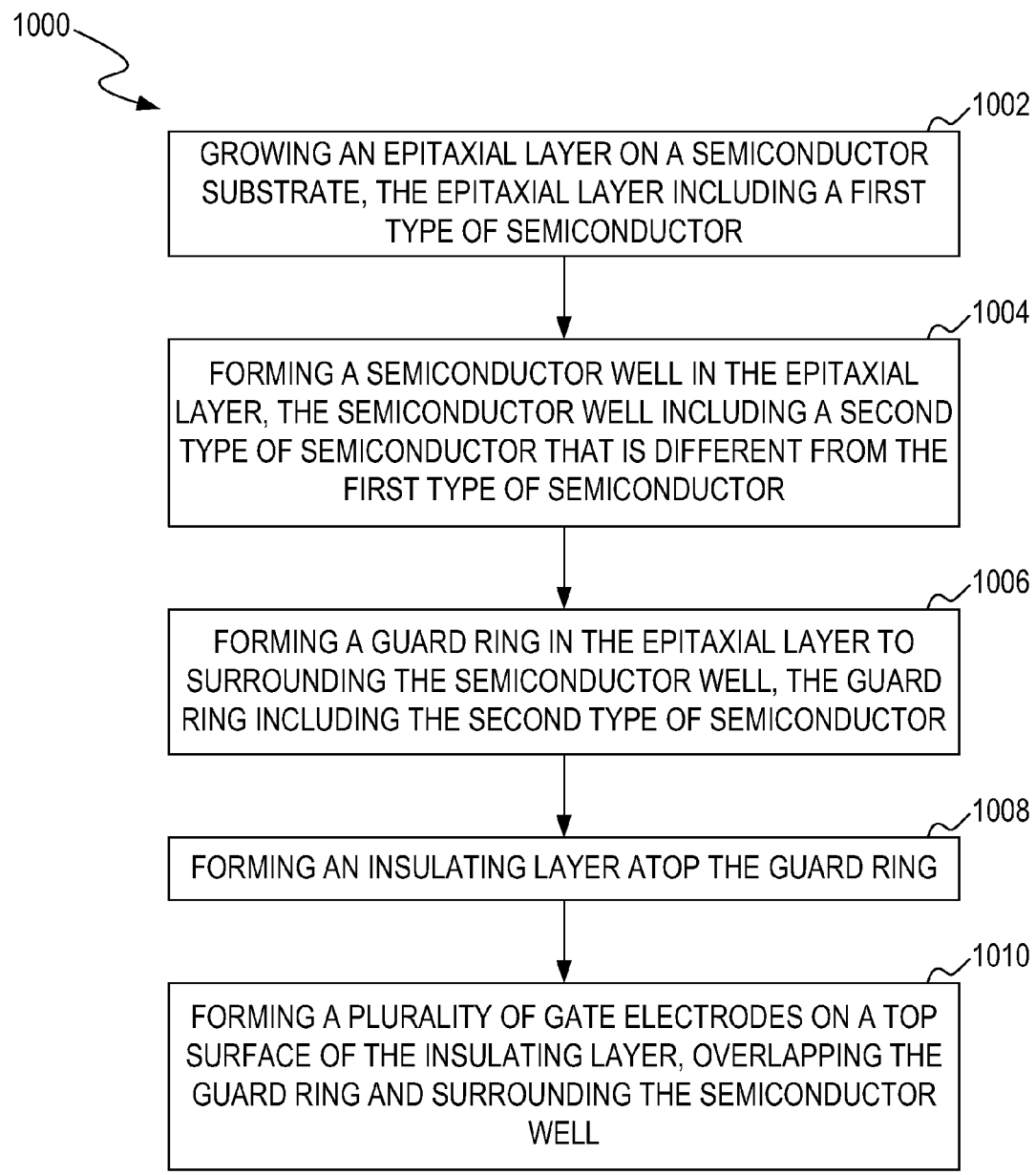
FIG. 10 shows an example of a method for forming an integrated device having multiple transistors, in an embodiment according to the present invention.

FIG. 10 shows an example of a method 1000 for forming/fabricating an integrated device having multiple transistors, in an embodiment according to the present invention. Although specific steps are disclosed in FIG. 10, such steps are examples. That is, the present invention is well suited to performing various other steps or variations of the steps recited in FIG. 10. FIG. 10 is described in combination with FIGS. 2A, 2B, 2C, 3A, 3B, 3C, 4A, 4B, 4C. 4D. 5, 6A, 6B, 6C, 7, 8A(1), 8A(2), 8B(1), 8B(2), 8C(1), 8C(2), 8D(1), 8D(2), 8E(1), 8E(1), 9A, and 9B.

In block 1002, an epitaxial layer (e.g., 218 or 618) is grown on a semiconductor substrate (e.g., 220). The epitaxial layer (e.g., 218 or 618) and the semiconductor substrate (e.g., 220) include a first type of semiconductor, e.g., n-type semiconductor.

In block 1004, a semiconductor well (e.g., 212, 612 or 712) is formed in the epitaxial layer (e.g., 218 or 618). The semiconductor well (e.g., 212, 612 or 712) includes a second type of semiconductor, e.g., p-type semiconductor, that is different from the first type of semiconductor.

In block 1006, a guard ring (e.g., 210 or 610) is formed in the epitaxial layer (e.g., 218 or 618) to surrounding the semiconductor well (e.g., 212, 612 or 712). The guard ring (e.g., 210 or 610) includes the second type of semiconductor, e.g., p-type semiconductor.

In block 1008, an insulating layer (e.g., 208) is formed atop the guard ring (e.g., 210 or 610), the semiconductor well (e.g., 212, 612 or 712), and the epitaxial layer (e.g., 218 or 618).

In block 1010, multiple gate electrodes (e.g., 202 and 204, 602 and 604, 701-708, 202A and 204A, 202B and 204B, . . . , or 202E and 204E) are formed on a top surface (e.g., 278) of the insulating layer (e.g., 208), overlapping the guard ring (e.g., 210 or 610) and surrounding the semiconductor well (e.g., 212, 612 or 712). In an embodiment, the gate electrodes include a first gate electrode and a second gate electrode separated by a gap (e.g., 222, 622, 222A, 222B, . . . , or 222E). The top surface of the insulating layer and a side wall (e.g., 258) of the first gate electrode (e.g., 202, 602, 202A, 202B, . . . , or 202E) have a first intersecting line (e.g., 332, 632, 332A, 332B, . . . , or 332E) therebetween, at the gap above the guard ring. The top surface of the insulating layer and a side wall of the second gate electrode (e.g., 204, 604, 204A, 204B, . . . , or 204E) also have a second intersecting line (e.g., 336, 636, 336A, 336B, . . . , or 336E) therebetween, at the gap above the guard ring. The first intersecting line (e.g., 332, 632, 332A, 332B, . . . , or 332E) partially overlaps an area (e.g., shadowed by dashed lines as shown in FIG. 3B, FIG. 6C, FIG. 8A(2), FIG. 8B(2), FIG. 8C(2), FIG. 8D(2), or FIG. 8E(2)) of the top surface of the insulating layer above the guard ring. The area is defined by the second intersecting line (e.g., 336, 636, 336A, 336B, . . . , or 336E) and an imaginary straight line (e.g., 380, 680, 380A, 380B, . . . , or 380E) through the gap and between a first point (e.g., 338, 638, 338A, 338B, . . . , or 338E) of the second intersecting line and a second point (e.g., 340, 640, 340A, 340B, . . . , or 340E) of the second intersecting line.

In summary, embodiments according to the present invention provide integrated devices. The integrated device includes multiple transistors that share a drain region and a source region. The multiple transistors are represented by multiple gate electrodes that are separated from each other. The gaps between the gate electrodes have specified shapes to avoid leakage of electric field under the gaps. As a result, the integrated device can have a relatively high breakdown voltage and a relatively large UIS/avalanche current. Additionally, compared with a conventional design, the integrated device can have a smaller size, less power consumption, higher frequency response, better efficiency, a denser 2N+1 architecture (e.g., an architecture in which transistors share a common drain in a substrate), and better heat dissipation. The integrated device in embodiments according to the present invention can be used in applications such as DC-DC converters, super servers, CPU, GPU, etc.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. An integrated device comprising:
   a semiconductor well formed in an epitaxial layer, wherein said epitaxial layer comprises a first type of semiconductor, and said semiconductor well comprises a second type of semiconductor that is different from said first type of semiconductor;
   a first guard ring formed in said epitaxial layer and surrounding said semiconductor well, wherein said first guard ring comprises said second type of semiconductor;
   an insulating layer formed atop said first guard ring; and
   a plurality of gate electrodes formed on a top surface of said insulating layer, overlapping said first guard ring and surrounding said semiconductor well,
   wherein said gate electrodes comprise a first gate electrode and a second gate electrode separated by a gap, wherein said first gate electrode comprises a first side wall above said first guard ring and facing said gap, wherein said second gate electrode comprises a second side wall above said first guard ring and facing said gap, wherein said gap is formed between said first and second side walls above said first guard ring, wherein said gap is shaped so that a first intersecting line between said top surface and said first side wall partially overlaps a first area of said top surface above said first guard ring, and wherein said first area is defined by a second intersecting line between said top surface and said second side wall and by a straight line through said gap and between a first point of said second intersecting line and a second point of said second intersecting line.

2. The integrated device as claimed in claim 1, wherein said gate electrodes comprise a plurality of transistors, wherein said transistors have a common drain region and a common source region.

3. The integrated device as claimed in claim 2, wherein said transistors comprise an OR gate.

4. The integrated device as claimed in claim 2, wherein said common drain region comprises a part of said epitaxial layer, and wherein said common source region is formed in said semiconductor well and comprises said first type of semiconductor.

5. The integrated device as claimed in claim 1, wherein said first gate electrode, said insulating layer, and said first guard ring comprise a first capacitor, and wherein said second gate electrode, said insulating layer, and said first guard ring comprise a second capacitor.

6. The integrated device as claimed in claim 5, wherein when a voltage is applied to said integrated device to cause an electric field extending from said semiconductor well to said first guard ring, said first and second capacitors terminate the part of said electric field that is in an area under said gap.

7. The integrated device as claimed in claim 6, wherein said first and second capacitors are operable for holding charges thereby terminating said electric field.

8. The integrated device as claimed in claim 1, wherein said first type of semiconductor comprises n-type semiconductor, and said second type of semiconductor comprises p-type semiconductor.

9. The integrated device as claimed in claim 1, further comprising:
a trench-like structure surrounding said semiconductor well; and
a second guard ring formed on a side wall of said trench-like structure and surrounding said semiconductor well, wherein said insulating layer is formed atop said second guard ring, and wherein said first and second gate electrodes are formed on said top surface of said insulating layer overlapping said second guard ring.

10. The integrated device as claimed in claim 9, wherein said first gate electrode further comprises a third side wall above said second guard ring and facing said gap, wherein said second gate electrode further comprises a fourth side wall above said second guard ring and facing said gap, wherein said gap is also formed between said third and fourth side walls above said second guard ring, wherein said gap is also shaped so that a third intersecting line between said top surface and one of said third and fourth side walls partially overlaps a second area of said top surface above said second guard ring, and wherein said second area is defined by a fourth intersecting line between said top surface and the other one of said third and fourth side walls and by a straight line between a third point of said fourth intersecting line and a fourth point of said fourth intersecting line.

11. An integrated device comprising:
a plurality of transistors comprising a common source region and a common drain region, and comprising a plurality of gate electrodes formed on a top surface of an insulating layer and surrounding said common source region, wherein said common drain and common source regions comprise a first type of semiconductor;
a first guard ring formed beneath said insulating layer, overlapped by said gate electrodes and surrounding said common source region, wherein said first guard ring comprises a second type of semiconductor that is different from said first type of semiconductor,
wherein said gate electrodes comprise a first gate electrode and a second gate electrode separated by a gap, wherein said first gate electrode comprises a first side wall above said first guard ring and facing said gap, wherein said second gate electrode comprises a second side wall above said first guard ring and facing said gap, wherein said gap is formed between said first and second side walls above said first guard ring, wherein said gap is shaped so that a first intersecting line between said top surface and said first side wall partially overlaps a first area of said top surface above said first guard ring, and wherein said first area is defined by a second intersecting line between said top surface and said second side wall and by a straight line between a first point of said second intersecting line and a second point of said second intersecting line.

12. The integrated device as claimed in claim 11, wherein said common drain region comprises a part of a semiconductor substrate on which said transistors are formed, wherein said common source region is formed in a semiconductor well surrounded by said first guard ring, and wherein said semiconductor well comprises said second type of semiconductor.

13. The integrated device as claimed in claim 11, wherein said transistors comprise an OR gate.

14. The integrated device as claimed in claim 11, wherein said first gate electrode, said insulating layer, and said first guard ring comprise a first capacitor, and wherein said second gate electrode, said insulating layer, and said first guard ring comprise a second capacitor.

15. The integrated device as claimed in claim 14, further comprising a semiconductor well formed between said common source region and said common drain region and surrounded by said first guard ring, wherein when a voltage is applied to said integrated device to cause an electric field extending from said semiconductor well to said first guard ring, said first and second capacitors terminate the part of said electric field that is in an area under said gap.

16. The integrated device as claimed in claim 15, wherein said first and second capacitors are operable for holding charges thereby terminating said electric field.

17. The integrated device as claimed in claim 11, wherein said first type of semiconductor comprises n-type semiconductor, and said second type of semiconductor comprises p-type semiconductor.

18. The integrated device as claimed in claim 11, further comprising:
a trench-like structure surrounding said common source region; and
a second guard ring formed on a side wall of said trench-like structure and surrounding said common source region, wherein said insulating layer is formed atop said second guard ring, and wherein said first and second gate electrodes are formed on said top surface of said insulating layer overlapping said second guard ring.

19. The integrated device as claimed in claim 11, wherein said first gate electrode further comprises a third side wall above said second guard ring and facing said gap, wherein said second gate electrode further comprises a fourth side wall above said second guard ring and facing said gap, wherein said gap is also formed between said third and fourth side walls above said second guard ring, wherein said gap is also shaped so that a third intersecting line between said top surface and one of said third and fourth side walls partially overlaps a second area of said top surface above said second guard ring, and wherein said second area is defined by a fourth intersecting line between said top surface and the other one of said third and fourth side walls and by a straight line between a third point of said fourth intersecting line and a fourth point of said fourth intersecting line.

* * * * *